(12) United States Patent
Du et al.

(10) Patent No.: US 11,615,719 B2
(45) Date of Patent: Mar. 28, 2023

(54) DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Mengmeng Du, Beijing (CN); Xiangdan Dong, Beijing (CN); Hongwei Ma, Beijing (CN); Jun Yan, Beijing (CN); Bo Cheng, Beijing (CN)

(73) Assignees: Chengdu BOE Optoelectronics Technology Co., Ltd., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 138 days.

(21) Appl. No.: 17/115,935

(22) Filed: Dec. 9, 2020

(65) Prior Publication Data
US 2021/0192987 A1    Jun. 24, 2021

(30) Foreign Application Priority Data
Dec. 19, 2019    (CN) .......................... 201911320847.7

(51) Int. Cl.
| | | |
|---|---|---|
| *G09F 9/30* | (2006.01) | |
| *G09G 3/00* | (2006.01) | |
| *H01L 27/32* | (2006.01) | |
| *H01L 51/52* | (2006.01) | |
| *H05K 1/18* | (2006.01) | |

(52) U.S. Cl.
CPC ............. *G09F 9/301* (2013.01); *G09G 3/006* (2013.01); *H01L 27/323* (2013.01); *H01L 27/3272* (2013.01); *H01L 27/3276* (2013.01); *H01L 51/5237* (2013.01); *H05K 1/189* (2013.01)

(58) Field of Classification Search
CPC ........... G09F 9/301; G09F 9/33; G09G 3/006; G09G 3/3208; G09G 2310/0297; G09G 2330/06; H01L 27/323; H01L 27/3272; H01L 27/3276; H01L 51/5237; H01L 27/3244; H01L 51/0031; H05K 1/189; H05K 1/0218; H05K 2201/10128; H05K 9/0054
See application file for complete search history.

(56) References Cited

U.S. PATENT DOCUMENTS

| | | | | |
|---|---|---|---|---|
| 10,878,734 | B1* | 12/2020 | Watsuda | ................... G09G 3/32 |
| 2010/0245286 | A1* | 9/2010 | Parker | ................... G06F 3/0445 |
| | | | | 345/174 |
| 2016/0266672 | A1* | 9/2016 | Inagaki | ............... H01L 51/0097 |
| 2017/0010740 | A1* | 1/2017 | Chuang | ............... G06F 3/04166 |
| 2017/0194355 | A1* | 7/2017 | Li | ......................... H01L 27/124 |

(Continued)

*Primary Examiner* — S M Sohel Imtiaz
(74) *Attorney, Agent, or Firm* — WHDA, LLP

(57) ABSTRACT

The present disclosure provides a display panel and a display device. The display panel includes: a base substrate including a display unit and a bendable unit, the bendable unit being connected to the display unit and bendable to a back of the display unit; a multiplexer on the bendable unit; and a metal shielding portion on a side of the multiplexer away from the base substrate, wherein an orthographic projection of the metal shielding portion on the base substrate covers an orthographic projection of the multiplexer on the base substrate, and the metal shielding portion is connected to a fixed voltage signal to shield signal interference caused by the multiplexer.

17 Claims, 10 Drawing Sheets

(56) References Cited

U.S. PATENT DOCUMENTS

| | | | |
|---|---|---|---|
| 2017/0235196 A1* | 8/2017 | Lai | G02F 1/1362 |
| | | | 349/46 |
| 2018/0175131 A1* | 6/2018 | Lee | H01L 27/3276 |
| 2018/0261147 A1* | 9/2018 | Lin | G06F 3/0412 |
| 2018/0307368 A1* | 10/2018 | Koide | H01L 27/1222 |
| 2018/0356683 A1* | 12/2018 | Higano | G06F 3/04164 |
| 2020/0127217 A1* | 4/2020 | Bae | H01L 51/0017 |
| 2020/0210022 A1* | 7/2020 | Kim | G06F 3/04166 |
| 2020/0310575 A1* | 10/2020 | He | H01L 27/3276 |

* cited by examiner

DISPLAY PANEL AND DISPLAY DEVICE

CROSS-REFERENCE TO RELATED APPLICATION

This application claims the benefit of Chinese Patent Application No. 201911320847.7 filed on Dec. 19, 2019 in the National Intellectual Property Administration of China, the whole disclosure of which is incorporated herein by reference.

TECHNICAL FIELD

The present disclosure relates to the field of display technology, and in particular, to a display panel and a display device.

BACKGROUND

In various kinds of display devices such as OLED display devices, a multiplexer (abbreviated as MUX) is usually provided. Voltage signals input by the multiplexer alternately changes between high voltage and low voltage, and the alternating voltage signals may generate electromagnetic radiation. Inside the display device, there is a circuit board opposite to the display panel. The circuit board is equipped with an overall antenna. The electromagnetic radiation generated by the multiplexer may cause electromagnetic interference to the overall antenna, thereby affecting the use effect of the overall antenna.

SUMMARY

In an aspect, a display panel is provided, comprising: a base substrate comprising a display unit and a bendable unit, the bendable unit being connected to the display unit and bendable to a back of the display unit; a multiplexer on the bendable unit, the multiplexer comprising a control terminal, an input terminal and an output terminal, wherein the multiplexer is configured to supply selectively signals from the input terminal to the output terminal under control of the control terminal; and a metal shielding portion on a side of the multiplexer away from the base substrate, wherein an orthographic projection of the metal shielding portion on the base substrate covers an orthographic projection of the multiplexer on the base substrate, and the metal shielding portion is connected to a fixed voltage signal to shield signal interference caused by the multiplexer.

According to some exemplary embodiments, an area of the orthographic projection of the metal shielding portion on the base substrate is larger than an area of the orthographic projection of the multiplexer on the base substrate.

According to some exemplary embodiments, the metal shielding portion is connected to a ground signal.

According to some exemplary embodiments, the multiplexer comprises at least a first transistor and a second transistor, and the first transistor and the second transistor comprises a gate electrode, a source electrode, and a drain electrode, respectively, and the display panel comprises a first conductive layer and a second conductive layer, the second conductive layer is located on a side of the first conductive layer away from the base substrate, the gate electrode is located in the first conductive layer, and the source electrode and the drain electrode are located in the second conductive layer.

According to some exemplary embodiments, the metal shielding portion is located on a side of the second conductive layer away from the base substrate; and the display panel further comprises a first insulating layer between the second conductive layer and a layer of the metal shielding portion.

According to some exemplary embodiments, the display panel further comprises a third conductive layer and a plurality of first power lines, and the plurality of first power lines are configured to provide a first power signal to the display unit, and the third conductive layer is located on a side of the second conductive layer away from the base substrate; and the metal shielding portion and at least one first power line are both located in the third conductive layer.

According to some exemplary embodiments, the display panel further comprises a first insulating layer between the second conductive layer and the third conductive layer.

According to some exemplary embodiments, the display panel further comprises: a light emitting device on the base substrate; an encapsulation layer located on the base substrate and encapsulating the light emitting device; and a first touch layer on a side of the encapsulation layer away from the base substrate, wherein the metal shielding portion is located in the first touch layer.

According to some exemplary embodiments, the display panel further comprises: a light emitting device on the base substrate; an encapsulation layer located on the base substrate and encapsulating the light emitting device; a first touch layer on a side of the encapsulation layer away from the base substrate, and a second touch layer on a side of the first touch layer away from the base substrate, wherein the metal shielding portion is located in the second touch layer.

According to some exemplary embodiments, the display panel further comprises a second insulating layer between the first touch layer and the second touch layer.

According to some exemplary embodiments, the display panel further comprises a flexible circuit board comprising a ground terminal, and the metal shielding portion is electrically connected to the ground terminal via a wire.

According to some exemplary embodiments, the display panel further comprises a flexible circuit board comprising a touch ground terminal, and the metal shielding portion is electrically connected to the touch ground terminal via a wire.

According to some exemplary embodiments, the metal shielding portion comprises a stacked layer structure formed of Ti/Al/Ti.

According to some exemplary embodiments, the display panel further comprises a plurality of touch electrodes on the display unit and a plurality of touch electrode lines electrically connected to the plurality of touch electrodes; and at least one of the plurality of touch electrode lines comprises a first sub-line and a second sub-line, the first sub-line is located in the first touch layer, the second sub-line is located in the second touch layer, and the first sub-line is electrically connected to the second sub-line through a conductive via hole.

According to some exemplary embodiments, the display panel further comprises a wiring area and a chip on the bendable unit, and the multiplexer is electrically connected to the chip via signal lines disposed in the wiring area.

According to some exemplary embodiments, the display panel further comprises a test unit disposed on the bendable unit, the test unit is located between the display unit and the metal shielding portion, and the test unit is electrically connected to the display unit for testing the display unit.

In another aspect, a display device is provided, wherein the display device comprises the display panel as described above.

DETAILED DESCRIPTION OF EMBODIMENTS

In order to enable those skilled in the art to better understand technical solutions of the present disclosure, the embodiments of the present disclosure may be described in further detail below with reference to the accompanying drawings and specific embodiments, but the following specific embodiments are not intended to limit the present disclosure.

Words such as "first", "second" and the like used in the present disclosure do not indicate any order, quantity or importance, but are only used to distinguish different parts. Words such as "include", "comprise" or the like mean that an element before the words contains element(s) listed after the words, and do not exclude containing other elements. Words such as "up", "down", "left", "right", and the like are only used to indicate a relative positional relationship. When an absolute position of the described object changes, the relative positional relationship may also change accordingly.

In this disclosure, when it is described that a specific device is located between first device and second device, there may or may not be an intermediate device between the specific device and the first device or the second device. When it is described that a specific device is connected to another device, the specific device may be directly connected to the another device without an intermediate device, or may be connected to the another device through an intermediate device.

All terms (including technical or scientific terms) used in the present disclosure have the same meaning as understood by those skilled in the art to which the present disclosure belongs, unless specifically defined otherwise. It should also be understood that terms such as those defined in general dictionaries should be interpreted as having meanings consistent with their meanings in the context of related technologies, and should not be interpreted in idealized or extremely formalized meanings, unless explicitly defined here.

Herein, the expression "same layer" refers to a layer structure which is formed by using the same film forming process to form a film layer for forming a specific pattern and then using the same one mask to pattern the film layer through one patterning process. According to different specific patterns, the one patterning process may include multiple exposure processes, development processes, or etching processes, and the specific patterns in the formed layer structure may be continuous or discontinuous. These specific patterns may be at different heights.

Figure 1:
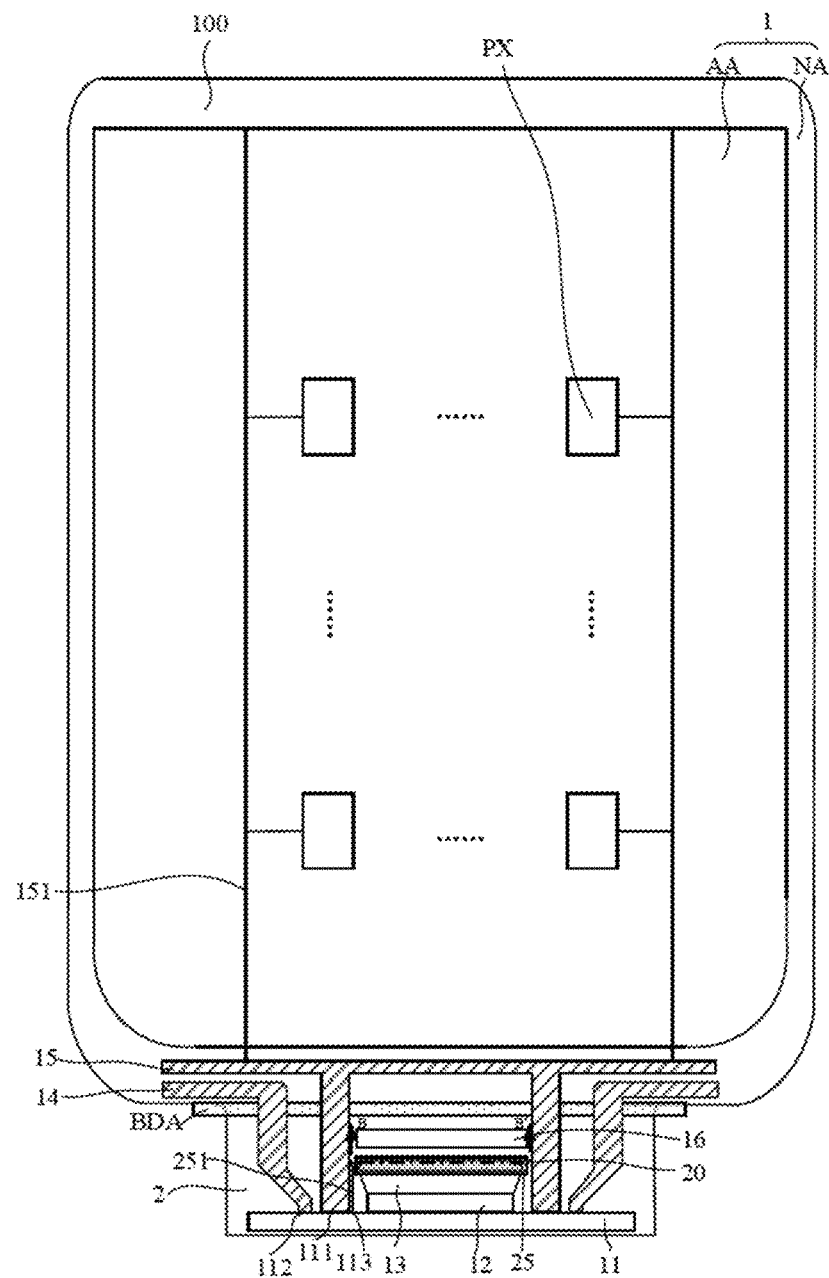
FIG. 1 is a plan view of a display panel according to some exemplary embodiments of the present disclosure.

FIG. 1 is a plan view of a display panel according to some exemplary embodiments of the present disclosure. With reference to FIG. 1, the display panel may include a base substrate 100, a plurality of sub-pixels PX, a plurality of first power lines 151, a first power bus line 15, and a second power line 14.

The base substrate 100 may include a display area AA and a peripheral area NA surrounding the display area AA.

The plurality of sub-pixels PX are in the display area AA. At least one of the plurality of sub-pixels PX includes a light-emitting element such as OLED. For example, the light-emitting element may include an anode on the base substrate, a light-emitting layer on a side of the anode away from the base substrate 100, and a cathode on a side of the light-emitting layer away from the base substrate 100. For example, the cathode may receive a common ground voltage signal Vss.

It should be noted that, in the embodiments of the present disclosure, when it is described that a structure is located on another structure, the one structure may be in direct contact with the another structure, or may not be in direct contact with the another structure.

As shown in FIG. 1, the plurality of first power lines 151 are in the display area AA. The plurality of first power lines 151 are electrically connected to the anodes of the light-emitting elements of the plurality of sub-pixels. It should be noted that when it is described that a specific device is electrically connected to another device, the specific device may be directly electrically connected to the another device without an intermediate device, or may not be directly electrically connected to the another device but with an intermediate device. For example, the first power line 151 may be electrically connected to the anode of the light-emitting element of the sub-pixel through several thin film transistors.

As shown in FIG. 1, the first power bus line 15 is located in the peripheral area NA on one side. The first power bus line 15 is electrically connected to the plurality of first power lines 151.

In some embodiments, the first power bus line 15 is configured to receive a first voltage signal, and the second power line 14 is configured to receive a second voltage signal. The first voltage signal is higher than the second voltage signal. For example, the first power bus line is configured to receive a power voltage signal Vdd, and the second power line is configured to receive a common ground voltage signal Vss.

With the development of the display industry, full screens have gradually become a trend. For example, in order to achieve a full screen, the display panel may adopt a COF design or a COP design. COF is an abbreviation of chip on flex or chip on film. In this design, a driver IC chip is fixed on a flexible circuit board, that is, a flexible circuit board is used as a package chip carrier. COP is an abbreviation of chip on PI. In this design, the material used for a back plate of the display panel is similar to the flexible print circuit board, and the back plate itself is flexible and may be rolled. Therefore, with regard to the COF, the screen packaged by COP manner may be directly folded backwards, thereby minimizing an occupation of the "chin" space by the screen module, and effectively narrowing the lower frame of the display panel, which is conducive to achieve the full screen.

Continuing to refer to FIG. 1, the display panel may be a display panel with COP design. For example, the base substrate 100 may be a flexible substrate, which includes a display unit 1 and a bendable unit 2. The display unit includes the above-mentioned display area AA and the peripheral area NA. The bendable unit 2 may be bent to the back of the display unit 1 along the bendable area BDA shown in FIG. 1.

For example, in the embodiment shown in FIG. 1, the bendable unit 2 may include a flexible circuit board 11, a chip 12, a wiring area 13, a multiplexer 20 and a test unit 16. The flexible circuit board 11, the chip 12, the wiring area 13, the multiplexer 20 and the test unit 16 are all arranged on a side of the bendable area BDA away from the display unit 1. For example, the test unit 16, the multiplexer 20, the wiring area 13, the chip 12 and the flexible circuit board 11 may be sequentially away from the bendable area BDA.

The flexible circuit board 11 may include a Vdd signal terminal 111 configured to provide a power voltage signal Vdd and a Vss signal terminal 112 configured to provide a common ground voltage signal Vss. The first power bus line 15 is electrically connected to the Vdd signal terminal 111 for receiving the power voltage signal Vdd, and the second power line 14 is electrically connected to the Vss signal terminal 112 for receiving the common ground voltage signal Vss.

As shown in FIG. 1, the multiplexer 20 is arranged below the bendable area BDA and adjacent to the chip 12. In this way, by bending the bendable unit 2, the multiplexer 20 may be folded to the back of the panel, so that the size of the display panel may be designed relatively compact, and the screen-to-body ratio of the display panel is increased. In addition, by arranging the multiplexer 20 at a position adjacent to the chip 12, interference during signal transmission may be reduced, an output impedance and a signal attenuation may be reduced, and signal clarity may be improved.

In this embodiment, the chip 12 is connected to the display area through signal lines densely arranged in the wiring area 13. By providing the multiplexer 20, the number of signal lines arranged in the wiring area 13 may be reduced, and the wiring difficulty in the wiring area 13 may be reduced.

Figure 2:
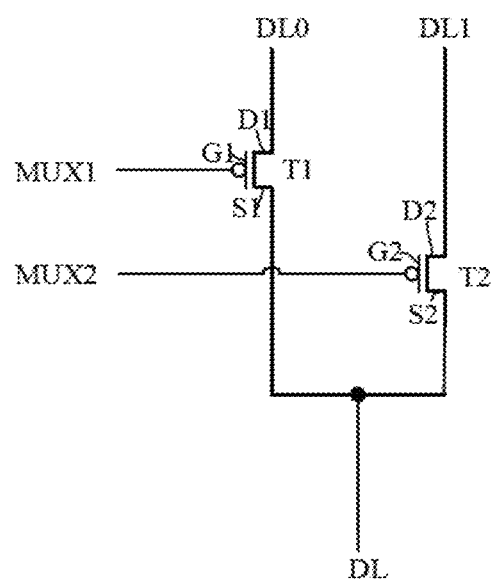
FIG. 2 is a schematic diagram of a MUX circuit.

The multiplexer 20 includes a signal terminal, an input terminal and an output terminal. The multiplexer is configured to supply selectively signals from the input terminal to the output terminal under control of the signal terminal. For example, a multiplexer (MUX) 20 may time-division multiplex the signal lines (for example, data lines on a source driver IC side) in the wiring area 13. FIG. 2 is a schematic diagram of a MUX circuit. Under control of signal terminals MUX1 and MUX2, the same one data line DL may successively transmit data signals to a first data sub-line DL0 and a second data sub-line DL1 respectively, thereby realizing the time division multiplexing of the same one data line. In the embodiment, the signal terminals MUX1 and MUX2 may be the control terminal of the multiplexer 20, the data line DL may be the input terminal of the multiplexer 20, and the first data sub-line DL0 and the second data sub-line DL1 may be the output terminal of the multiplexer 20. Under the control of the signal terminals MUX1 and MUX2, signals transmitted by the data line DL are supplied selectively to the first data sub-line DL0 or the second data sub-line DL1. In the embodiment shown in FIG. 2, the MUX circuit includes two thin film transistors, which includes a first transistor T1 and a second transistor T2. A gate electrode G1 of the first transistor Ti is electrically connected to the signal terminal MUX1, a first electrode S1 (such as the source electrode) of the first transistor Ti is electrically connected to the data line DL, and a second electrode D1 (such as the drain electrode) of the first transistor Ti is electrically connected to the first data sub-line DL0. A gate electrode G2 of the second transistor T2 is electrically connected to the signal terminal MUX2, a first electrode S2 (such as the source electrode) of the second transistor T2 is electrically connected to the data line DL, and a second electrode D2 (such as the drain electrode) of the second transistor T2 is electrically connected to the second data sub-line DL1.

Figure 3:
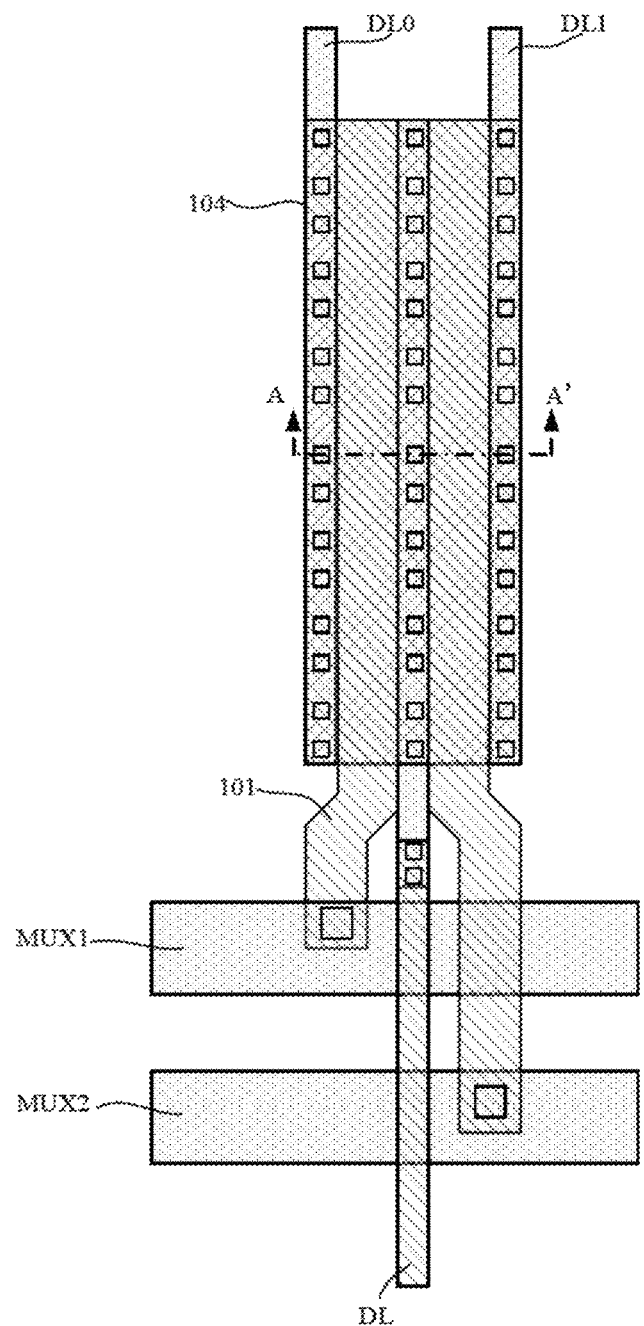
FIG. 3 is a schematic plan view of the MUX circuit shown in FIG. 2.
Figure 4:
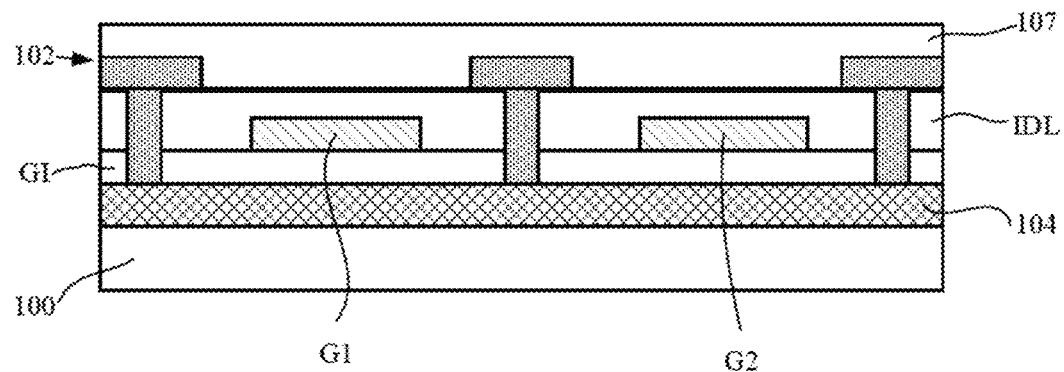
FIG. 4 is a schematic cross-sectional view taken along line AA' in FIG. 3.

FIG. 3 is a schematic plan view of the MUX circuit shown in FIG. 2, and FIG. 4 is a schematic cross-sectional view taken along line AA' in FIG. 3. With reference to FIGS. 1 to 4 in combination, the display panel may include a semiconductor layer 104, a first conductive layer 101, and a second conductive layer 102 on a base substrate 100. For example, an active layer of the transistors T1 and T2 included in the multiplexer 20 may be in the semiconductor layer 104, the gate electrodes G1 and G2 of the transistors T1 and T2 may be in the first conductive layer 101, and the first electrodes and the second electrodes of the transistors T1 and T2 may be in the second conductive layer 102. The data line DL may be in the first conductive layer 101, and the first data sub-line DL0, the second data sub-line DL1, and the signal terminals MUX1 and MUX2 may be in the second conductive layer 102.

The first conductive layer 101 may be formed of a material forming the gate electrode of the thin film transistor. For example, the material forming the gate electrode of the thin film transistor may include metal materials, such as Mo, Al, Cu, and alloys thereof.

The second conductive layer 102 may be formed of a material forming the source electrode and drain electrode of the thin film transistor. For example, the material forming the source electrode and drain electrode of the thin film transistor may include a stacked layer structure formed of Ti/Al/Ti. The stacked layer structure has good conductivity, which may reduce power consumption and reduce signal attenuation during signal transmission.

The semiconductor layer 104 may be formed of a semiconductor material forming the active layer of the transistor. For example, the semiconductor material may include amorphous silicon, polysilicon, oxide semiconductor, etc., and the oxide semiconductor material may include, for example, IGZO (Indium Gallium Zinc Oxide), ZnO (zinc oxide), etc.

Continuing to refer to FIGS. 3 and 4, the display panel may further include a gate insulating layer GI between the semiconductor layer 104 and the first conductive layer 101, a interlayer dielectric layer IDL between the first conductive layer 101 and the second conductive layer 102, and a first insulating layer 107 covering the second conductive layer 102. For example, the first insulating layer 107 may include at least one selected from insulating layers such as a passivation layer and a planarization layer. That is, the first insulating layer 107 may have a single-layer structure or a stacked layer structure composed of a plurality of insulating layers.

Referring back to FIG. 1, the display panel may further include a metal shielding portion 25. The metal shielding portion 25 is located on a side of the multiplexer 20 away from the base substrate 100, and an orthographic projection of the metal shielding portion 25 on the base substrate 100 covers an orthographic projection of the multiplexer 20 on the base substrate 100. For example, in some embodiments, an area of the orthographic projection of the metal shielding portion 25 on the base substrate 100 is larger than an area of the orthographic projection of the multiplexer 20 on the base substrate 100. The metal shielding portion 25 may be connected to a fixed voltage signal, such as a ground signal. In this way, the metal shielding portion 25 may shield signal interference caused by the multiplexer 20.

Figure 5:
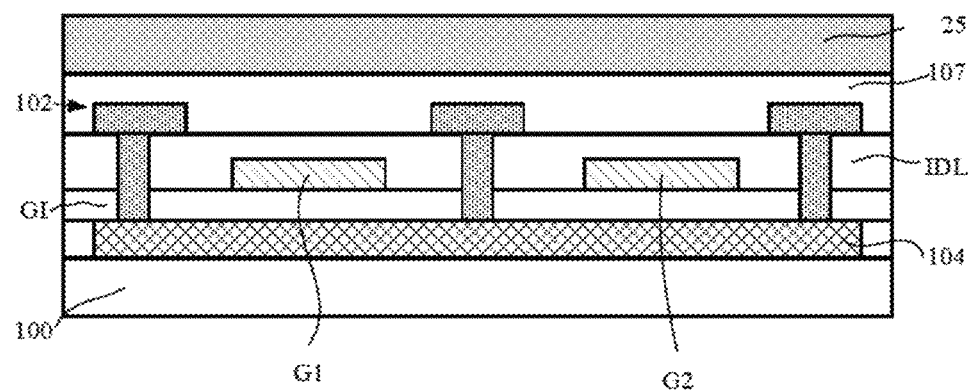
FIG. 5 is a schematic cross-sectional view of a display panel according to some exemplary embodiments of the present disclosure taken along line BB' in FIG. 1.

FIG. 5 is a schematic cross-sectional view of a display panel according to some exemplary embodiments of the present disclosure taken along line BB' in FIG. 1. With reference to FIGS. 1 and 5 in combination, the metal shielding portion 25 may be on a side of the first insulating layer 107 away from the base substrate 100.

The flexible circuit board 11 further includes a ground terminal 113 for providing a ground signal, and the metal shielding portion 25 may be electrically connected to the ground terminal 113 for receiving the ground signal (i.e., a GND signal). For example, the metal shielding portion 25 may be electrically connected to the ground terminal 113 via a wire 251.

In the above embodiment, the metal shielding portion 25 is located on the side of the multiplexer 20 away from the base substrate, and the first insulating layer for insulating isolation is located between the metal shielding portion 25 and the multiplexer 20. The metal shielding portion 25 is connected to the ground terminal 113 via a wire. In this way, the multiplexer 20 is shielded, mutual interference between the multiplexer 20 and antenna signal of the display module may be avoided, and the performance of the product is improved. In addition, the metal shielding portion 25 may replace the wave absorbing material, thereby reducing the product cost.

In the embodiment of FIG. 5, the first data sub-line DL0, the second data sub-line DL1, and the signal terminals MUX1 and MUX2 of the multiplexer 20 may be in the second conductive layer 102, and the first power bus line 15, the second power line 14, and the plurality of first power lines 151 may also be in the second conductive layer 102. The metal shielding portion 25 is located in a layer different from the second conductive layer 102, that is, it is located in a separate conductive layer. For example, the metal shielding portion 25 may include a stacked layer structure formed of Ti/Al/Ti. The first insulating layer 107 is configured to isolate the conductive layer where the metal shielding portion 25 is located from the second conductive layer 102 to prevent the second conductive layer 102 and the metal shielding portion 25 from being short-circuited.

As shown in FIG. 1, the metal shielding portion 25 is connected to the flexible circuit board 11 through the ground terminal 113 (GND), that is, the metal shielding portion 25 shares the ground with the flexible circuit board 11, which may effectively prevent signal distortion and disorder caused by noise interference caused by the ground potential difference. In specific implementation, after the display panel provided by the embodiment of the present disclosure is assembled into an entirety in the module stage, the GND signal is input when the power is turned on, which may shield the signal interference between the multiplexer 20 and the antenna of the display module.

In addition, a test unit 16 is located between the multiplexer 20 and the bendable area BDA, and the test unit 16 is configured to test whether the display unit 1 may work normally. The multiplexer 20 and the test unit 16 are designed on the bendable unit 2, and they may be folded to the back of the display panel along with the bendable unit 2, so that the size of the display panel may be designed relatively compact, and the screen-to-body ratio of the display panel is increased. Therefore, a full screen may be better realized.

Figure 6:
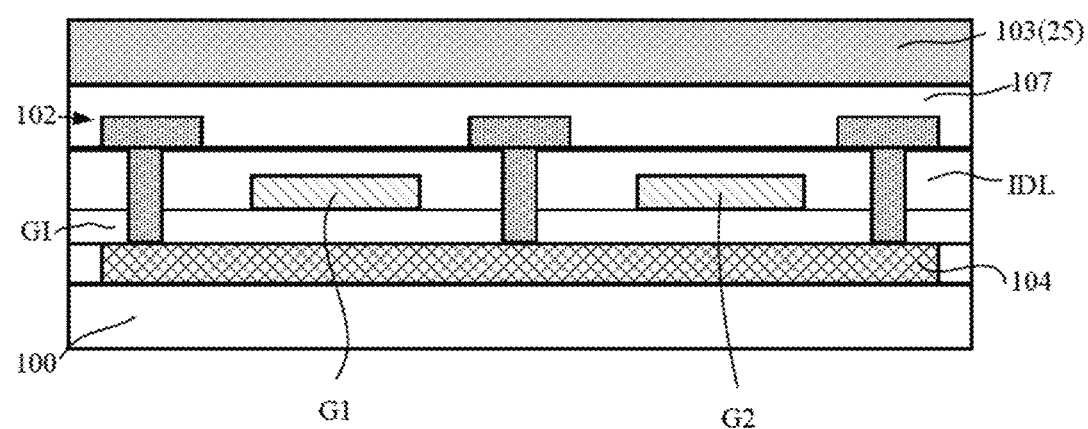
FIG. 6 is a schematic cross-sectional view of a display panel according to some exemplary embodiments of the present disclosure taken along line BB' in FIG. 1.

Optionally, the display panel may include a third conductive layer 103. FIG. 6 is a schematic cross-sectional view of a display panel according to some exemplary embodiments of the present disclosure taken along line BB' in FIG. 1. With reference to FIGS. 1 and 6 in combination, the third conductive layer 103 may be on a side of the first insulating layer 107 away from the base substrate 100.

For example, the third conductive layer 103 may be formed of a material forming the source electrode and drain electrode of a thin film transistor, for example, the material forming the source electrode and drain electrode of the thin film transistor may include a stacked layer structure formed of Ti/Al/Ti. The stacked layer structure has good conductivity, which may reduce power consumption and reduce signal attenuation during signal transmission.

At least some of the first power bus line 15, the second power line 14, the plurality of the first power lines 151, the first data sub-line DL0, the second data sub-line DL1, and the signal terminals MUX1, MUX2 of the multiplexer 20 may in the third conductive layer 103. For example, the first data sub-line DL0, the second data sub-line DL1, and the signal terminals MUX1, MUX2 of the multiplexer 20, and the first power bus line 15 may be in the second conductive layer 102, and the second power line 14 and the plurality of first power lines 151 may be in the third conductive layer 103. For another example, the first data sub-line DL0, the second data sub-line DL1, the signal terminals MUX1, MUX2 of the multiplexer 20, the first power bus line 15, the second power line 14, and the plurality of first power lines 151 may be in the second conductive layer 102, and the plurality of first power lines 151 may also be in the third conductive layer 103. That is, the plurality of first power lines 151 may be in both the second conductive layer 102 and the third conductive layer 103, and the first power lines 151 in the second conductive layer 102 and the first power lines 151 in the third conductive layer 103 may be connected in parallel to reduce resistances of the first power lines.

With the advent of full screens, the frame of the display panel becomes narrower. The line width of the power signal line correspondingly becomes smaller, and the impedance of the power signal line increases. In this way, the signal transmitted on the power signal line has a greater power loss during it is transmitted from a bottom end (lower end in FIG. 1) to a top end (upper end in FIG. 1) of the display panel, thereby affecting the uniformity of the screen display. In the embodiment of the present disclosure, the first power lines 151 may be arranged in both the second conductive layer 102 and the third conductive layer 103, and the power lines in the second conductive layer and the power lines in the third conductive layer may be connected in parallel, thereby increasing the line width of power signal line and reducing the impedance of the power signal line correspondingly, so that the uniformity of the screen display may be improved.

The metal shielding portion 25 is located in the third conductive layer 103, that is, at least a part of the first power lines 151 and the metal shielding portion 25 are both located in the third conductive layer 103. In other words, the metal shielding portion 25 may also be formed of a material forming the source electrode and drain electrode of the thin film transistor. For example, the material forming the source electrode and drain electrode of the thin film transistor may include a stacked layer structure formed of Ti/Al/Ti.

Similarly, as shown in FIG. 1, the metal shielding portion 25 is connected to the flexible circuit board 11 through the ground terminal 113 (GND), that is, the metal shielding portion 25 shares the ground with the flexible circuit board 11, which may effectively prevent signal distortion and disorder caused by noise interference caused by the ground potential difference. In specific implementation, after the display panel provided by the embodiment of the present disclosure is assembled into an entirety in the module stage, the GND signal is input when the power is turned on, which may shield the signal interference between the multiplexer 20 and the antenna of the display module.

Figure 7:
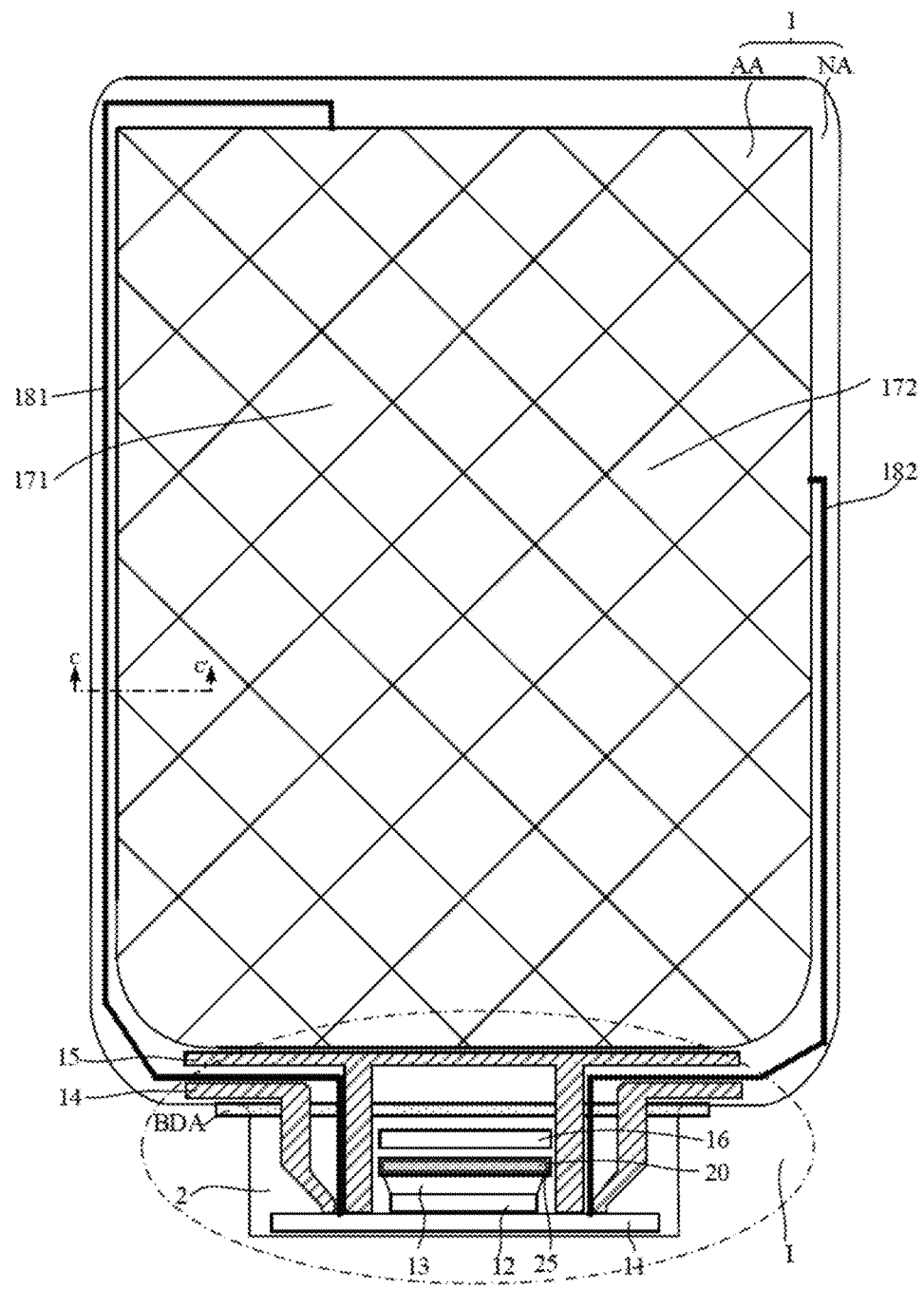
FIG. 7 is a plan view of a display panel according to some exemplary embodiments of the present disclosure.

FIG. 7 is a plan view of a display panel according to some exemplary embodiments of the present disclosure. With reference to FIGS. 1 and 7 in combination, the display panel may include a base substrate 100, a plurality of sub-pixels PX, a plurality of first power lines 151, a first power bus line 15, and a second power line 14.

As shown in FIG. 7, the display panel may further include a plurality of first touch electrodes 171 and a plurality of second touch electrodes 172 in the display area AA; and a plurality of first touch electrode lines 181 and a plurality of second touch electrode lines 182 in the peripheral area NA. The first touch electrodes 171 are electrically connected to the first touch electrode lines 181, and the second touch electrodes 172 are electrically connected to the second touch electrode lines 182.

In some embodiments, the first touch electrode lines 181 may be signal transmitting lines, and the second touch electrode lines 182 may be signal receiving lines; or the first touch electrode lines 181 may be signal receiving lines, and the second touch electrode lines 182 may be signal transmitting lines.

In some embodiments, as shown in FIG. 7, the plurality of first touch electrode lines 181 and the plurality of second touch electrode lines 182 may be electrically connected to the flexible circuit board 11 respectively.

In some embodiments, the display panel may adopt FMLOC technology. FMLOC (Flexible Multi-Layer on Cell) technology is a touch technology. In the FMLOC technology, touch electrodes are fabricated on an encapsulation layer. In the FMLOC technology, in order to prevent signal crosstalk between the touch electrode lines and other lines of the panel, the touch electrode lines may be shielded through a common ground line.

Figure 8:
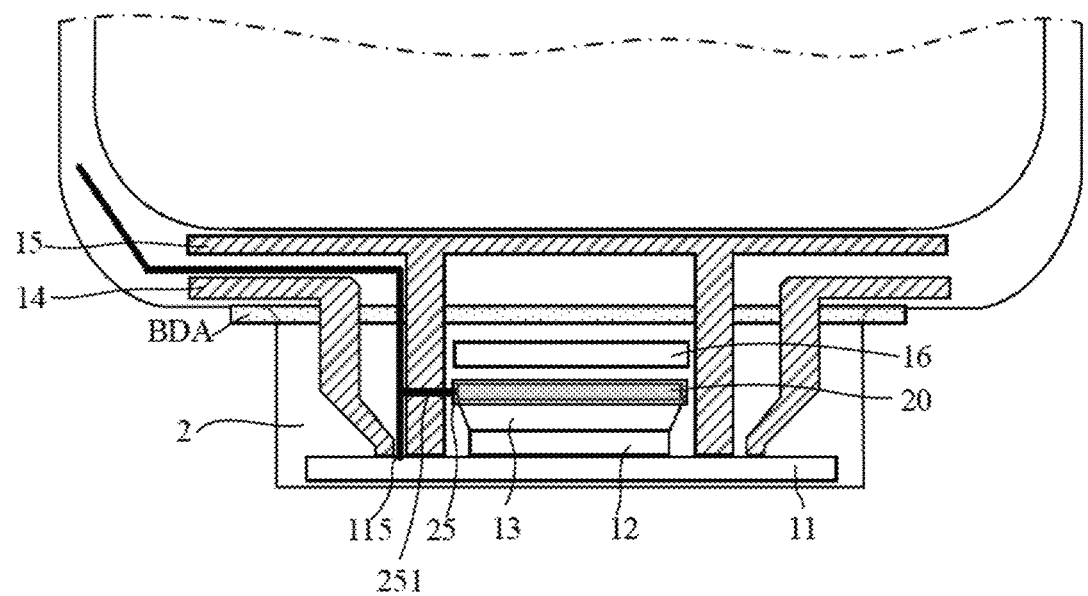
FIG. 8 is a partial enlarged view of part I in FIG. 7.
Figure 9:
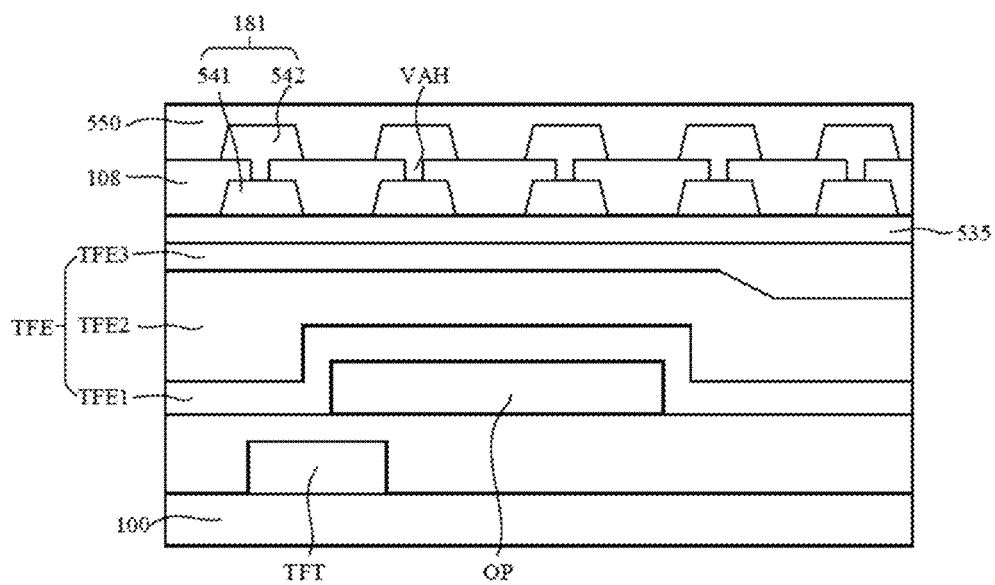
FIG. 9 is a schematic cross-sectional view taken along line CC' in FIG. 7.

FIG. 8 is a partial enlarged view of part I in FIG. 7, and FIG. 9 is a schematic cross-sectional view taken along line CC' in FIG. 7. With reference to FIGS. 7-9 in combination, the display panel may include a thin film transistor TFT on the base substrate 100; a light emitting device OP on a side of the thin film transistor TFT away from the base substrate 100; and an encapsulation layer TFE on a side of light emitting device OP away from the base substrate 100. For example, the light emitting device OP may be an OLED.

As shown in FIG. 9, the encapsulation layer TFE may include: a first inorganic encapsulation layer TFE1 on a side of the light emitting device OP away from the base substrate 100; an organic encapsulation layer TFE2 on a side of the first inorganic encapsulation layer TFE1 away from the base substrate 100; and a second inorganic encapsulation layer TFE3 on a side of the organic encapsulation layer TFE2 away from the base substrate 100. For example, the material of the first inorganic encapsulation layer TFE1 may include silicon nitride, etc., the material of the organic encapsulation layer TFE2 may include PMMA (poly (methylmethacrylate), also known as acrylic), etc., and the material of the second inorganic encapsulation layer TFE3 may include silicon nitride, etc.

In some embodiments, as shown in FIG. 9, the display panel may further include a barrier layer 535 on a side of the encapsulation layer TFE away from the base substrate 100. For example, the material of the barrier layer 535 may include an inorganic insulating material.

The plurality of first touch electrode lines 181 and the plurality of second touch electrode lines 182 may be on a side of the barrier layer 535 away from the base substrate 100. In some embodiments, as shown in FIG. 9, at least one first touch electrode line 181 and/or at least one second touch electrode line 182 may include a first sub-line 541 on the barrier layer 535 and a second sub-line 542 on a side of the first sub-line 541 away from the barrier layer 535. For example, the first sub-line 541 may include a Ti/Al/Ti (titanium/aluminum/titanium) three-layer structure, and the second sub-line 542 may include a Ti/Al/Ti (titanium/aluminum/titanium) three-layer structure.

As shown in FIG. 9, the display panel may further include: a second insulating layer 108 between the first sub-line 541 and the second sub-line 542. For example, the material of the second insulating layer 108 may include silicon nitride, silicon oxide, or silicon oxynitride. In each of the touch electrode lines 181 and 182, the first sub-line 541 may be electrically connected to the second sub-line 542 through a conductive via hole VAH, which may reduce the resistance of the touch electrode lines.

In some embodiments, as shown in FIG. 9, the display panel may further include a cover layer 550 covering the plurality of touch electrode lines. For example, the material of the covering layer 550 may include an organic insulating material or an inorganic insulating material.

That is, the display panel may include two touch layers. For the convenience of description, the two touch layers are referred to as the first touch layer TMA and the second touch layer TMB, respectively. For example, the layer where the first sub-line 541 is located may be the first touch layer TMA, and the layer where the second sub-line 542 is located may be the second touch layer TMB. For example, the touch layers may be made of metal materials, so that the touch layers may also be referred to as touch metal layers.

In some embodiments, the metal shielding portion 25 may be in the first touch layer TMA, and the metal shielding portion 25 may be electrically connected to the touch ground terminal 115.

Figure 10:
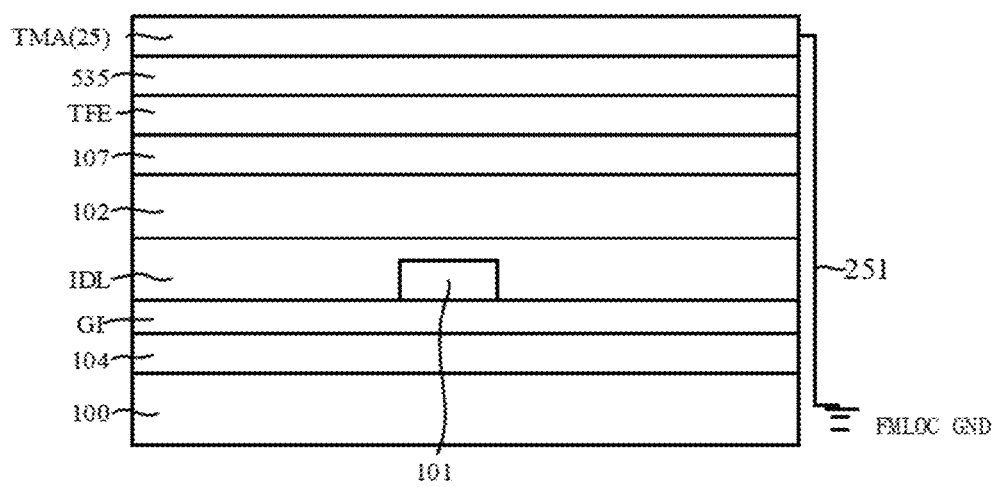
FIG. 10 is a schematic diagram schematically showing a stacked layer structure of a display panel at a position where a metal shielding portion is located according to an embodiment of the present disclosure.

FIG. 10 is a schematic diagram schematically showing a stacked layer structure of a display panel at a position where a metal shielding portion is located according to an embodiment of the present disclosure. With reference to FIGS. 8 and 10 in combination, the flexible circuit board 11 further includes a touch ground terminal 115 for providing a touch ground signal, and the metal shielding portion 25 may be electrically connected to the touch ground terminal 115 for receiving the touch ground signal (i.e., FMLOC GND signal). For example, the metal shielding portion 25 may be electrically connected to the touch ground terminal 115 via a wire 251.

In this embodiment, the metal shielding portion 25 is connected to the touch ground terminal 115 via the wire 251, which may effectively prevent signal distortion and disorder caused by noise interference caused by the ground potential difference, and reduce the number of pins (PINs) of the flexible circuit board 11.

Figure 11:
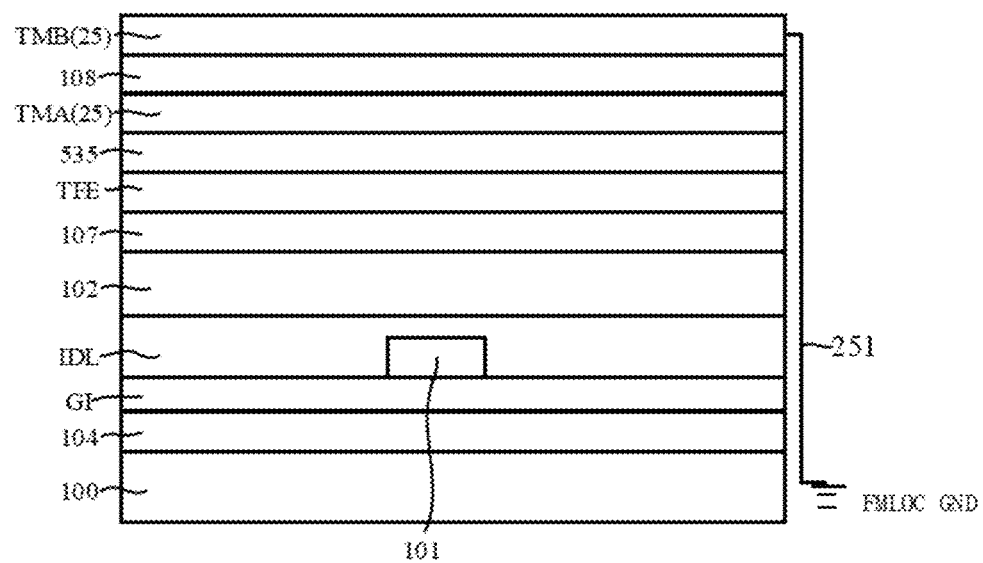
FIG. 11 is a schematic diagram schematically showing a stacked layer structure of a display panel at a position where a metal shielding portion is located according to an embodiment of the present disclosure.

FIG. 11 is a schematic diagram schematically showing a stacked layer structure of a display panel at a position where a metal shielding portion is located according to an embodiment of the present disclosure. With reference to FIGS. 7 to 11, the display panel may include the first conductive layer 101, the second conductive layer 102, the third conductive layer 103, the first touch layer TMA, and the second touch layer TMB as described above.

In some embodiments, the metal shielding portion 25 may be in the second touch layer TMB, and the metal shielding portion 25 may be electrically connected to the touch ground terminal 115.

Similarly, the flexible circuit board 11 further includes a touch ground terminal 115 for providing a touch ground signal, and the metal shielding portion 25 may be electrically connected to the touch ground terminal 115 for receiving the touch ground signal (i.e., FMLOC GND signal). For example, the metal shielding portion 25 may be electrically connected to the touch ground terminal 115 via a wire 251.

In this embodiment, the metal shielding portion 25 is connected to the touch ground terminal 115 via the wire 251, which may effectively prevent signal distortion and disorder caused by noise interference caused by the ground potential difference, and reduce the number of pins (PINs) of the flexible circuit board 11. In addition, the distance between the metal shielding portion 25 in the second touch layer TMB and the multiplexer 20 is relatively large, so that the parasitic capacitance generated between the metal shielding portion 25 in the second touch layer TMB and the multiplexer 20 is relatively small.

Figure 12:
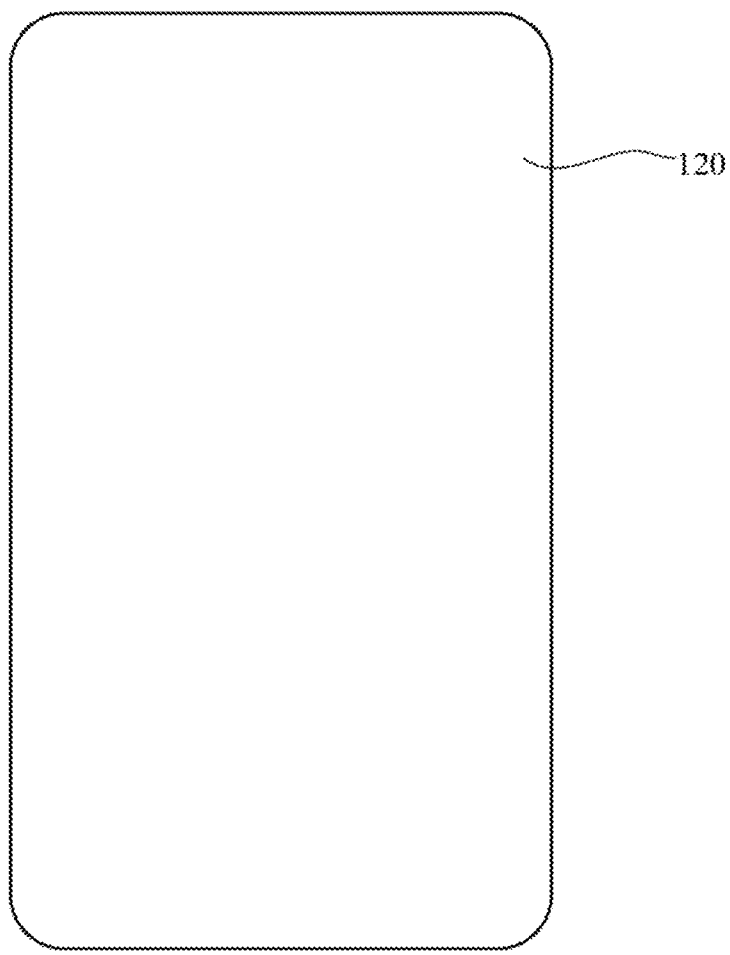
FIG. 12 is a schematic diagram of a display device according to an embodiment of the present disclosure.

Referring to FIG. 12, at least some embodiments of the present disclosure also provide a display device 120. The display device may include the display panel as described above.

The display device 120 may include any device or product with a display function. For example, the display device may be a smart phone, a mobile phone, an e-book reader, a desktop computer (PC), a laptop PC, a notebook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

It should be understood that the display device according to the embodiment of the present disclosure has all the features and advantages of the above-mentioned display panel. Details of the display device may refer to the above description, which will not be repeated here.

Although some embodiments of the general technical concept of the present disclosure have been shown and described, those of ordinary skill in the art will understand that changes may be made to these embodiments without departing from the principle and spirit of the general technical concept. The scope of the present disclosure shall be defined by the claims and their equivalents.

What is claimed is:

1. A display panel, comprising:
   a base substrate comprising a display unit and a bendable unit, the bendable unit being connected to the display unit and bendable to a back of the display unit;
   a multiplexer on the bendable unit, the multiplexer comprising a control terminal, an input terminal and an output terminal, wherein the multiplexer is configured to supply selectively signals from the input terminal to the output terminal under control of the control terminal; and
   a metal shielding portion on a side of the multiplexer away from the base substrate, wherein an orthographic projection of the metal shielding portion on the base substrate covers an orthographic projection of the multiplexer on the base substrate, and the metal shielding portion is connected to a fixed voltage signal to shield signal interference caused by the multiplexer,
   wherein the multiplexer comprises at least a first transistor and a second transistor, and the first transistor and the second transistor each comprises a gate electrode, a source electrode, and a drain electrode, respectively, and
   the display panel comprises a first conductive layer and a second conductive layer, the second conductive layer is located on a side of the first conductive layer away from the base substrate, the gate electrode is located in the first conductive layer, and the source electrode and the drain electrode are located in the second conductive layer; and
   wherein the display panel further comprises a third conductive layer and a plurality of first power lines, and the plurality of first power lines are configured to provide a first power signal to the display unit, and the third conductive layer is located on a side of the second conductive layer away from the base substrate; and
   the metal shielding portion and at least one first power line are both located in the third conductive layer.

2. The display panel of claim 1, wherein an area of the orthographic projection of the metal shielding portion on the base substrate is larger than an area of the orthographic projection of the multiplexer on the base substrate.

3. The display panel of claim 1, wherein the metal shielding portion is connected to a ground signal.

4. The display panel of claim 1, wherein the metal shielding portion is located on a side of the second conductive layer away from the base substrate; and
   the display panel further comprises a first insulating layer between the second conductive layer and a layer of the metal shielding portion.

5. The display panel of claim 1, wherein the display panel further comprises a first insulating layer between the second conductive layer and the third conductive layer.

6. The display panel of claim 1, wherein the display panel further comprises:
   a light emitting device on the base substrate;
   an encapsulation layer located on the base substrate and encapsulating the light emitting device; and
   a first touch layer on a side of the encapsulation layer away from the base substrate,
   wherein the metal shielding portion is located in the first touch layer.

7. The display panel of claim 1, wherein the display panel further comprises:
   a light emitting device on the base substrate;
   an encapsulation layer located on the base substrate and encapsulating the light emitting device;
   a first touch layer on a side of the encapsulation layer away from the base substrate, and
   a second touch layer on a side of the first touch layer away from the base substrate,
   wherein the metal shielding portion is located in the second touch layer.

8. The display panel of claim 7, wherein the display panel further comprises a second insulating layer between the first touch layer and the second touch layer.

9. The display panel of claim 3, wherein the display panel further comprises a flexible circuit board comprising a ground terminal, and the metal shielding portion is electrically connected to the ground terminal via a wire.

10. The display panel of claim 7, wherein the display panel further comprises a flexible circuit board comprising a touch ground terminal, and the metal shielding portion is electrically connected to the touch ground terminal via a wire.

11. The display panel of claim 4, wherein the metal shielding portion comprises a stacked layer structure formed of Ti/Al/Ti.

12. The display panel of claim 1, wherein the metal shielding portion comprises a stacked layer structure formed of Ti/Al/Ti.

13. The display panel of claim 7, wherein the metal shielding portion comprises a stacked layer structure formed of Ti/Al/Ti.

14. The display panel of claim 7, wherein the display panel further comprises a plurality of touch electrodes on the display unit and a plurality of touch electrode lines electrically connected to the plurality of touch electrodes; and at least one of the plurality of touch electrode lines comprises a first sub-line and a second sub-line, the first sub-line is located in the first touch layer, the second sub-line is located in the second touch layer, and the first sub-line is electrically connected to the second sub-line through a conductive via hole.

15. The display panel of claim 1, wherein the display panel further comprises a wiring area and a chip on the bendable unit, and the multiplexer is electrically connected to the chip via signal lines disposed in the wiring area.

16. The display panel of claim 1, wherein the display panel further comprises a test unit disposed on the bendable unit, the test unit is located between the display unit and the metal shielding portion, and the test unit is electrically connected to the display unit for testing the display unit.

17. A display device, wherein the display device comprises the display panel of claim 1.

* * * * *